(12) United States Patent
Tateishi (10) Patent No.: US 9,438,168 B2
(45) Date of Patent: Sep. 6, 2016

(54) OSCILLATOR

(71) Applicant: CANON KABUSHIKI KAISHA, Tokyo (JP)

(72) Inventor: Yoshinori Tateishi, Naka-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/770,413

(22) PCT Filed: Feb. 17, 2014

(86) PCT No.: PCT/JP2014/054247
§ 371 (c)(1),
(2) Date: Aug. 25, 2015

(87) PCT Pub. No.: WO2014/132901
PCT Pub. Date: Sep. 4, 2014

(65) Prior Publication Data
US 2016/0020730 A1    Jan. 21, 2016

(30) Foreign Application Priority Data
Feb. 27, 2013  (JP) .................................. 2013-037666

(51) Int. Cl.
*H03B 7/08*    (2006.01)
*H03B 7/14*    (2006.01)
*H03B 9/12*    (2006.01)

(52) U.S. Cl.
CPC *H03B 7/08* (2013.01); *H03B 7/14* (2013.01); *H03B 2009/123* (2013.01); *H03B 2200/0084* (2013.01); *H03B 2202/03* (2013.01)

(58) Field of Classification Search
CPC ...... H03B 7/08; H03B 9/12; H03B 2009/00; H03B 2009/12; H03B 2009/123; H03B 2200/0084; H03K 3/315

USPC .............................................. 331/107 T, 132
See application file for complete search history.

(56) References Cited

U.S. PATENT DOCUMENTS 3,573,659 A * 4/1971 Dydyk .................. H03B 9/142
                                                    331/107 G
3,691,481 A    9/1972 Kataoka
(Continued)

OTHER PUBLICATIONS

M. Reddy, et al.; IEEE Electron Device Letters, "Monolithic Schottky-Collector Resonant Tunnel Diode Oscillator Arrays to 650 GHz", vol. 18, No. 5, May 1997.
(Continued)

*Primary Examiner* — Levi Gannon
(74) *Attorney, Agent, or Firm* — Canon U.S.A., Inc., IP Division (57) ABSTRACT

An oscillator includes a resonator configured to resonate an electromagnetic wave in a resonant axis direction and a capacitance unit electrically connected in parallel to the resonator. The resonator includes a negative resistor, a first conductive layer, and a second conductive layer, where the negative resistor has a gain to the electromagnetic wave and is disposed between and in contact with the first conductive layer and the second conductive layer. At a resonant frequency $f_{LC}$ generated by an inductance Ls which the wiring configured to electrically connect the capacitance unit to the resonator and the capacitance unit constitute, and an inner capacitance Cwg of the resonator, a conductance including the inductance Ls, a resistance component Rs of the wiring and the capacitance unit, and a capacitance C of the capacitance unit is equal to or higher than an absolute value Gwg of negative conductance of the negative resistor.

10 Claims, 9 Drawing Sheets

(56) References Cited

U.S. PATENT DOCUMENTS

| | | | | |
|---|---|---|---|---|
| 4,728,907 | A * | 3/1988 | Cohen | H03L 1/021 |
| | | | | 331/107 DP |
| 5,539,761 | A * | 7/1996 | Golub | B82Y 10/00 |
| | | | | 372/38.02 |
| 5,675,295 | A * | 10/1997 | Brebels | H01L 21/8252 |
| | | | | 257/E21.697 |
| 5,825,240 | A * | 10/1998 | Geis | H03K 3/315 |
| | | | | 257/25 |
| 7,898,348 | B2 * | 3/2011 | Mukai | H03B 7/08 |
| | | | | 331/107 DP |
| 8,125,281 | B2 * | 2/2012 | Sekiguchi | H03B 7/08 |
| | | | | 257/25 |
| 2012/0001698 | A1 | 1/2012 | Koyama | |
| 2012/0105161 | A1 * | 5/2012 | Ouchi | H03B 9/12 |
| | | | | 331/107 T |
| 2012/0119838 | A1 * | 5/2012 | Koyama | H03B 7/08 |
| | | | | 331/115 |

OTHER PUBLICATIONS

Benjamin S. Williams, et al.; Applied Physics Letters, "Terahertz quantum-cascade laser at λ≈100 μm using metal waveguide for mode confinement", vol. 83, No. 11, Sep. 15, 2003, USA.

M. Reddy, et al.; IEEE Microwave and Guided Wave Letters, "Bias Stabilization for Resonant Tunnel Diode Oscillators", vol. 5, No. 7, Jul. 5, 1995, New York, USA.

E.R. Brown, et al.; Applied Physics Letters, "Oscillations up to 712 GHz in InAs/AlSb resonant-tunneling diodes", May 20, 1991, New York, USA.

* cited by examiner

OSCILLATOR

TECHNICAL FIELD

The present invention relates to oscillators, and more specifically to an oscillator for electromagnetic waves in a frequency range from a millimeter wave band to a terahertz wave band (from 30 GHz to 30 THz) (hereinafter, also referred to as terahertz waves).

BACKGROUND ART

In the frequency range of terahertz waves, many organic molecules in biological materials, medicines and, electronic materials have absorption peaks due to their structures and states. Furthermore, terahertz waves have high transmissivity to materials, such as paper, ceramics, resin, and cloth. In recent years, researches and developments have been performed on imaging technology and sensing technology making use of such characteristics of terahertz waves. The technology has been expected to be applied to, for example, a safe fluoroscopic inspection apparatus as an alternative to an X-ray apparatus and an in-line non-destructive inspection apparatus in a manufacturing process.

As a terahertz wave light source of a current injection type, a structure has been studied. The structure uses an electromagnetic wave gain based on intersubband transition of electrons in a semiconductor quantum well structure. Non-Patent Literature 1 (NPL 1) discusses an oscillator using a resonant tunneling diode (RTD) as a negative resistance device and a slot antenna as a resonator. The slot antenna in NPL 1 includes metallic patterns on a semiconductor substrate and the end portion of the slot has a capacitance. The oscillator of NPL 1 further includes a rectifying diode. Here, the rectifying diode serves as a stabilization circuit for suppressing parasitic oscillation posing a problem in an oscillator with a negative resistance device. The term "parasitic oscillation" refers to oscillation parasitically occurring in a band of low frequency waves different from desired frequency. Such parasitic oscillation causes a significant decrease in an oscillation output at the desired frequency. Thus, the presence of a stabilization circuit in an oscillator with a negative resistance device is very important.

When $\lambda_{osc}$ is an oscillation wavelength of an oscillator, and $\omega_{osc}$ is an oscillation frequency, in order to suppress the parasitic oscillation, an impedance on a power supply side for bias supply should be low in a frequency range of equal to or larger than direct current (DC) and smaller than $\omega_{osc}$. As a technique for achieving this purpose, a low impedance circuit serving as the stabilization circuit (e.g., a shunt rectifier diode) can be arranged at a position within $\lambda_{osc}/4$ as viewed from the RTD toward the power supply side. Thus, in an example of NPL 1, a rectifier diode is arranged in an integrated state as such a low impedance circuit at a position within $\lambda_{osc}/4$ as viewed from the RTD toward the side of the power supply.

On the other hand, Non-Patent Literature 2 (NPL 2) discusses a double-sided metal (DSM) waveguide structure as a low-loss terahertz waveguide in a quantum cascade laser (QCL). Here, if the DSM waveguide is used as a RTD resonator, frequency stabilization is important because the RTD has gain over a wide frequency range from DC to terahertz wave band while the QCL has gain over a narrow frequency range.

CITATION LIST

Non Patent Literature

[NPL 1]
IEEE Electron Device Letters, Vol. 18, 218 (1997)
[NPL 2]
Appl. phys. Lett. 83, 2124 (2003)

SUMMARY OF INVENTION

Technical Problem

In NPL 1, the method for suppressing parasitic oscillation is to be applied to a configuration of a slot-type resonator. Thus, it is not easily applied when a DSM waveguide is used as a resonator. Furthermore, when a structure employing a plasmon waveguide structure as a resonator is used in a RTD oscillator as discussed in NPL 2, parasitic oscillation may occur due to a power supply bias circuit, or unintended resonance may occur due to inner capacitance within the plasmon waveguide structure, or self inductance caused by wiring. As a result, oscillation output generated in the plasmon waveguide serving as a resonator significantly decreases.

Solution to Problem

According to an aspect of the present invention, an oscillator includes a resonator configured to resonate an electromagnetic wave in a resonant axis direction and a capacitance unit electrically connected in parallel to the resonator. The resonator includes a negative resistor, a first conductive layer, and a second conductive layer, where the negative resistor has a gain to the electromagnetic wave and is disposed between and in contact with the first conductive layer and the second conductive layer. At a resonant frequency $f_{LC}$ generated by an inductance Ls which the wiring configured to electrically connect the capacitance unit to the resonator and the capacitance unit constitute, and an inner capacitance Cwg of the resonator, a conductance including the inductance Ls, a resistance component Rs of the wiring and the capacitance unit, and a capacitance C of the capacitance unit is equal to or higher an absolute value Gwg of negative conductance of the negative resistor.

Further features and aspects of the present invention will become apparent from the following detailed description of exemplary embodiments with reference to the attached drawings.

BRIEF DESCRIPTION OF DRAWINGS

The accompanying drawings, which are incorporated in and constitute a part of the specification, illustrate exemplary embodiments, features, and aspects of the invention and, together with the description, serve to explain the principles of the invention.

DESCRIPTION OF EMBODIMENTS

Various exemplary embodiments, features, and aspects of the invention will be described in detail below with reference to the drawings.

The oscillator according to an exemplary embodiment of the present invention has a conductance equal to or higher than an absolute value Gwg of negative conductance of a negative resistor at the resonant frequency $f_{LC}$. The conductance includes an inductance Ls and a resistance component Rs arising from wiring and a capacitance C of a capacitance unit. Namely, the resistance of the wiring and the capacitance unit is set by placing the resonator and the capacitance unit close to each other to make the conductance equal to or higher than an absolute value of the conductance of the negative resistor.

Exemplary embodiments and examples of the present invention will be described. One exemplary embodiment of the oscillator will be described with reference to FIGS. 1 to 3. In these figures, the oscillator of the present exemplary embodiment includes a resonator 110, a capacitance unit 109, and a resistor (represented by R306 in a circuit in FIG. 3). The resonator 110 includes a negative resistor 103, a first conductive layer 102, and a second conductive layer 104. In the resonator 110, the negative resistor 103 has a gain with respect to an electromagnetic wave and is disposed between and in contact with the first conductive layer 102 and the second conductive layer 104. The capacitance unit 109 includes a dielectric layer 105, the first conductive layer 102, and a third conductive layer 106. The resonator 110 is integrated on a substrate 101, and an interlayer insulation film 107 is disposed on the side portion of the resonator 110.

Figure 1:
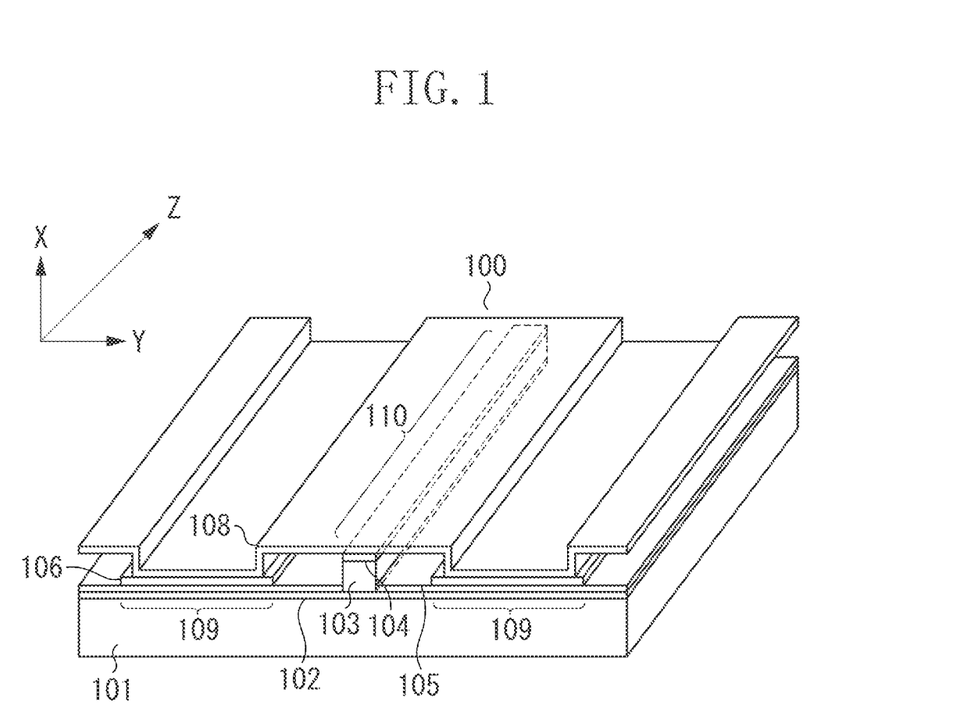
FIG. 1 is a perspective view of an oscillator according to an exemplary embodiment of the present invention.
Figure 2:
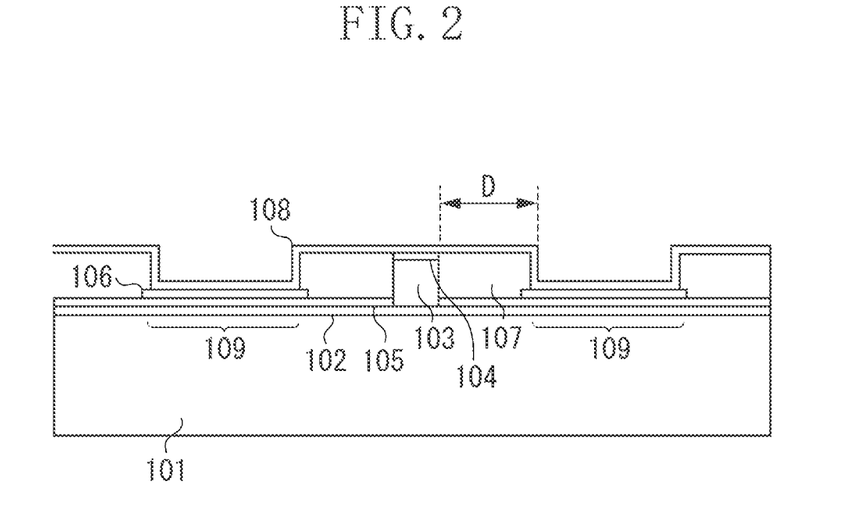
FIG. 2 is a cross-sectional view of the oscillator according to the exemplary embodiment of the present invention.

The negative resistor 103 includes a semiconductor multi-layered film that generates a terahertz wave and has an electromagnetic wave gain in a terahertz wave frequency range. The negative resistor 103 may be, for example, a resonant-tunneling diode (RTD) or a Gunn diode. In the present exemplary embodiment, the RTD is used as a negative resistor 103. The oscillator is configured to apply a bias between the first conductive layer 102 and the second conductive layer 104 from an external power supply in order to apply the bias to the negative resistor 103. Here, the first conductive layer 102 and the second conductive layer 104 may be suitably formed of a metal such as Ti, Mo, W, Ag, Au, Cu, Al, or Au-In alloy, a semimetal such as Bi, Sb, ITO, or ErAs, a highly-doped semiconductor, or the like. Alternatively, the first conductive layer 102 and the second conductive layer 104 may be obtained by stacking the layer of metal, semimetal, and highly-doped semiconductor.

The resonator 110 is a plasmon waveguide structure of a DSM type in which stacked films described below serve as a clad and the negative resistor 103 serves as a core. The RTD included in the negative resistor 103 is sandwiched between the first conductive layer 102 and the second conductive layer 104. In other words, the clad is formed of a stacked film of the first conductive layer 102 and the highly-doped semiconductive layer included in the negative resistor 103, and a stacked film of the second conductive layer 104 and the highly-doped semiconductive layer included in the negative resistor 103. Thus, the first conductive layer 102 and the second conductive layer 104 are close to each other to have a distance of $\lambda g/2$ or less, preferably about $\lambda g/10$, where $\lambda g$ denotes an oscillation wavelength defined by the resonator 110. That is, the first conductive layer 102 and the second conductive layer 104 of the resonator 110 respectively include negative dielectric constant medium in which the real part of dielectric constant is negative, and form a plasmon waveguide structure together with the negative resistor 103. Thus, an electromagnetic wave in the terahertz wave frequency range propagates through the resonator 110 in surface plasmon mode without diffraction limit. As is known in semiconductor laser technology, the oscillation wavelength $\lambda g$ is defined by setting the longitudinal length L of the resonator 110, which matches a direction of propagation of an electromagnetic wave, to the integral multiple of $\lambda g/2$. On the equivalent circuit of FIG. 3, the resonator 110 is represented using a capacitance Cwg302 and a conductance Gwg301, which are determined by the distance between two conductors, and the areas thereof. An oscillation frequency $f_0$ is mainly determined by the length and width of the resonator 110.

The oscillator of the present exemplary embodiment includes a capacitance unit 109 having the first conductive layer 102, the dielectric layer 105, and the third conductive layer 106. The capacitance unit 109 is provided in close to the resonator 110 having a stripe waveguide structure which is the plasmon waveguide structure, and separated by the interlayer insulation film 107. To suppress parasitic oscillation of a comparatively low frequency (up to several GHz) caused by a power supply bias circuit, a resistor 306 is electrically connected in parallel with the resonator 110 and the capacitance unit 109. In this way, the capacitance unit 109 is provided in parallel with the stripe waveguide structure. The resistance value R of the resistor 306 is preferably set to be equal to or less than an absolute resistance value of negative differential resistance of the negative resistor 103. This is because the resistance value should be equal to or less than the absolute negative resistance value, otherwise biasing cannot be performed in a negative resistance region. In other words, the resistance value of the power supply bias circuit defines the slope of a load line at the time of driving the negative resistor 103. In the circuit illustrated in FIG. 3, the capacitance unit 109 is represented by a capacitance C305 and has a task of suppressing the parasitic oscillation by the power supply bias circuit or the like.

The oscillator of the present exemplary embodiment further includes a fourth conductive layer 108 connecting to both the third conductive layer 106 and the second conductive layer 104. Alternatively, the fourth conductive layer 108 may be integrally formed with the third conductive layer 106 and the second conductive layer 104. Thus, the resonator 110 is electrically connected in parallel to the capacitance unit 109. Therefore, the characteristic features of the oscillator according to the present exemplary embodiment are the parallel connection between the capacitance unit 109 and the resonator 110 through the fourth conductive layer 108 and suppression of a parasitic oscillation of less than an oscillation frequency $f_O$ owing to the structure of such a connection.

Figure 3:
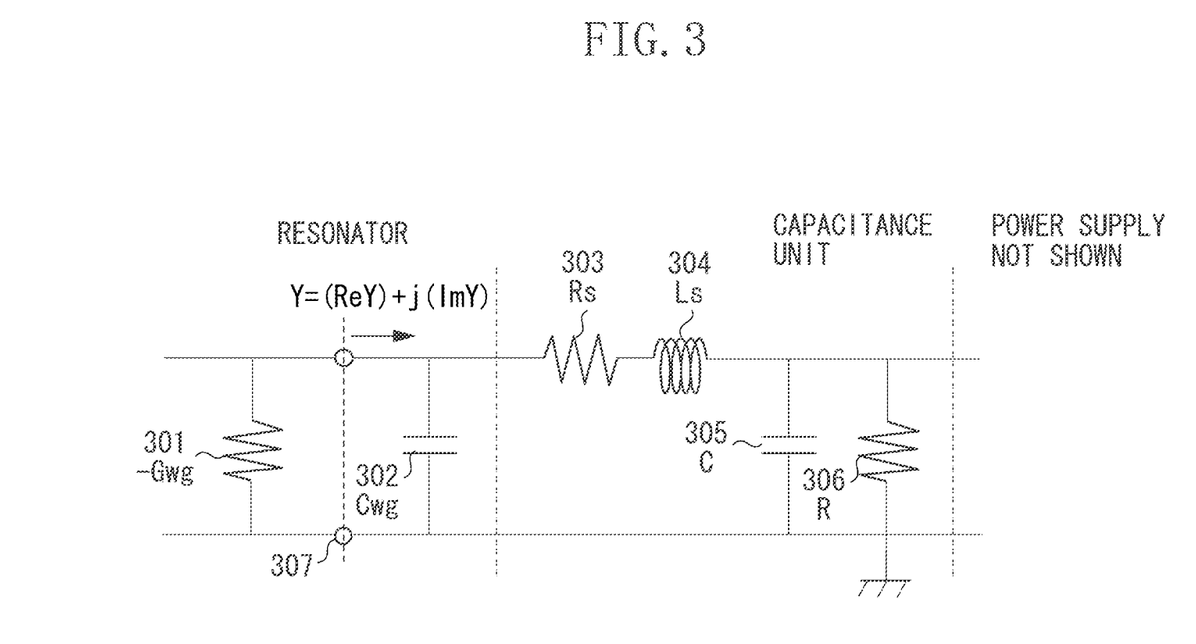
FIG. 3 is a circuit diagram illustrating the oscillator according to the exemplary embodiment of the present invention.

Here, a method for suppressing parasitic oscillation will be described below. The fourth conductive layer 108 which makes the connection between the resonator 110 and the capacitance unit 109, and the capacitance unit 109 have a self inductance Ls304 and a resistance component Rs303 according to the structure. In addition, the negative resistor 103 of the resonator 110 includes an inner capacitance Cwg302 and a conductance −Gwg301, which are determined by the distance and area between the conductors. There is a possibility that a parasitic oscillation at a resonant frequency $f_{LC}=1/(2\pi\sqrt{(LsCwg)})$ which is less than an oscillation frequency $f_O$ may occur with respect to the self inductance Ls304, and the inner capacitance Cwg302 of the negative resistor 103 in the resonator 110. Hence, an influence of parasitic oscillation due to LC resonance conventionally prevents the oscillator from obtaining stable oscillation at a desired oscillation frequency $f_O$ defined by the resonator 110 and the negative resistor 103.

The parasitic oscillation can be suppressed by increasing the real part of admittance (ReY) at a resonant frequency $f_{LC}$ to be ReY≥Gwg. Here, the admittance Y is admittance viewed from a port 37 in FIG. 3 to the outside of the resonator 110. The admittance can be represented by Y=(ReY)+j(ImY). Here, "ReY" represents a conductance component, which is the real part of admittance Y. "ImY" represents a susceptance component, which is an imaginary part of the admittance Y. The oscillator of the present exemplary embodiment is able to adjust the structure of the forth conductive layer 108 connecting between the resonator 110 and the capacitance unit 109, and the structure of the capacitance unit 109 to adjust the inductance Ls304 and the resistance component Rs303, thereby satisfying the aforementioned conditions for suppressing the parasitic oscillation. To increase the ReY at $f_{LC}$, both the resistance component Rs303 and the self inductance Ls304 may be reduced by reducing the distance D between the resonator 110 and the capacitance unit 109, or increasing the film thickness of the fourth conductive layer 108, or the like.

Figure 4A:
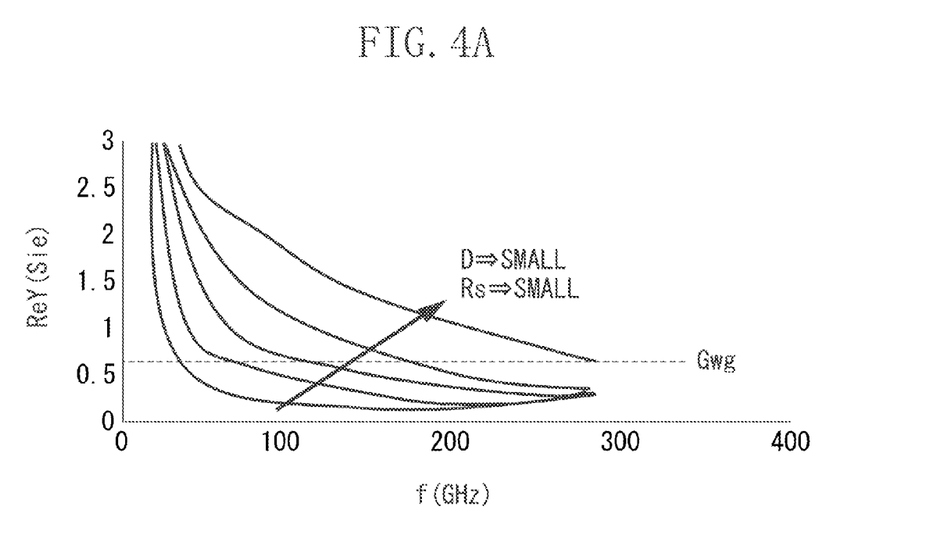
FIG. 4A is a diagram each illustrating the relationship between conductance and resistance.

FIG. 4A illustrates the frequency dependency of the ReY and the resistance component Rs303 in the oscillator of the present exemplary embodiment. Calculations are performed using HFSS (trade name) available from ANSYS Japan K.K. The oscillator of the present exemplary embodiment adjusts the resistance component Rs303 between the resonator 110 and the capacitance unit 109 to satisfy the aforementioned conditions (ReY≥Gwg) at the resonant frequency $f_{LC}$, thereby indicating presence of a region allowing the suppression of parasitic oscillation. Thus, the oscillator can obtain stable oscillation at a desired oscillation frequency $f_O$ defined by the negative resistor 103 and the resonator 110.

Figure 4B:
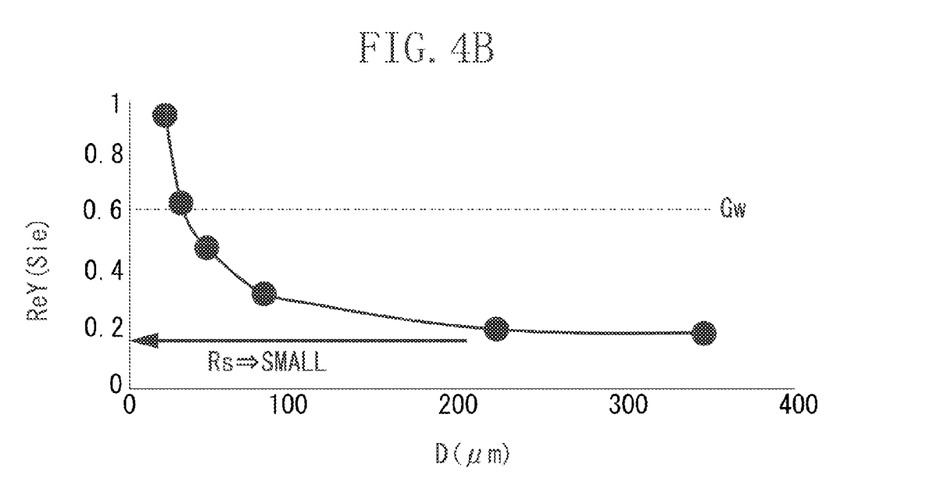
FIG. 4B is a diagram each illustrating the relationship between conductance and resistance.

FIG. 4B illustrates the dependency of the ReY at a resonant frequency and the distance D between the resonator 110 and the capacitance unit 109. At D=35 μm to 260 μm (0.168Ω to 0.18Ω in terms of Rs), the ReY at the resonant frequency $f_{LC}$ is less than Gwg (Gwg is approximately 0.6 S when the resonator 110 is 50 μm in length and 5 μm in width). Thus, the parasitic oscillation occurs. In addition, at D=25 μm or less (0.15Ω or less in terms of Rs), the ReY at the resonant frequency $f_{LC}$ is equal to or higher than Gwg. Thus, the parasitic oscillation can be suppressed. Since the fourth conductive layer 108 and the capacitance unit 109 are designed as described above, a desired oscillation frequency $f_O$ defined by the negative resistor 103 and the resonator 110 can be obtained. Here, the ReY is calculated from the relationship (ReY=1/Rs) between the self inductance Ls304 and the conductance at a series resonance frequency using the capacitance C305 of the capacitance unit 109. The ReY obtained as described above should be smaller than ReY at the resonant frequency $f_{LC}$. Thus, the oscillator designed as described above will reliably suppress the parasitic oscillation at the resonant frequency $f_{LC}$.

Figure 4C:
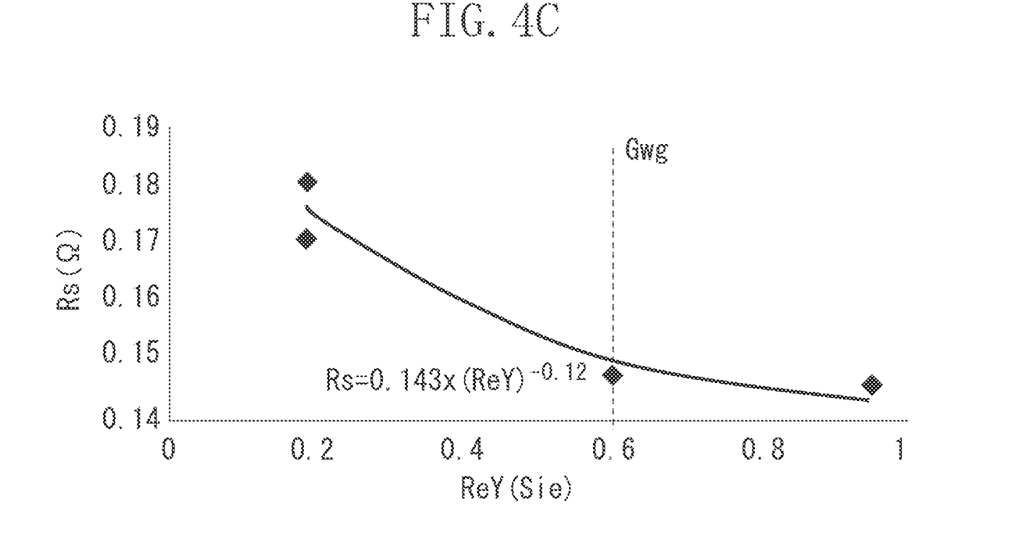
FIG. 4C is a diagram each illustrating the relationship between conductance and resistance.

FIG. 4C illustrates the dependency of the ReY and the resistance component Rs303 at the resonant frequency in the oscillator of the present exemplary embodiment. The relationship between the ReY and the Rs can be represented by the following approximate expression:

$$Rs=0.143\times(ReY)^{-0.12}$$

To suppress parasitic oscillation, the ReY may only satisfy ReY≥Gwg. Thus, the Rs may only satisfy the following expression:

$$Rs\leq 0.143\times(Gwg)^{-0.12} \quad \text{(Expression 1)}$$

where Gwg(S) represents an absolute value of conductance of the negative resistor 103. In the case that the Gwg changes as the length or width of the resonator 110 changes, both the fourth conductive layer 108 and the capacitance unit 109 may be designed to satisfy the above expression. Therefore, the oscillator of the present exemplary embodiment can make the resistor component Rs equal to or less than $0.143\times(Gwg)^{-0.12}\Omega$ to suppress parasitic oscillation.

As described above, parasitic oscillation can be suppressed by designing the oscillator as follows: At the above series resonance frequency, where Gwg represents an absolute value of negative conductance of the negative resistor 103 and Rs represents the resistance component, the inverse of the resistance component (1/Rs) is set to equal to or higher than Gwg. Alternatively, at the series resonance frequency, where Gwg represents an absolute value of negative conductance of the negative resistor 103 and Rs represents the resistance component, Rs is set to equal to or less than $0.143\times(Gwg)^{-0.12}\Omega$.

Figure 5:
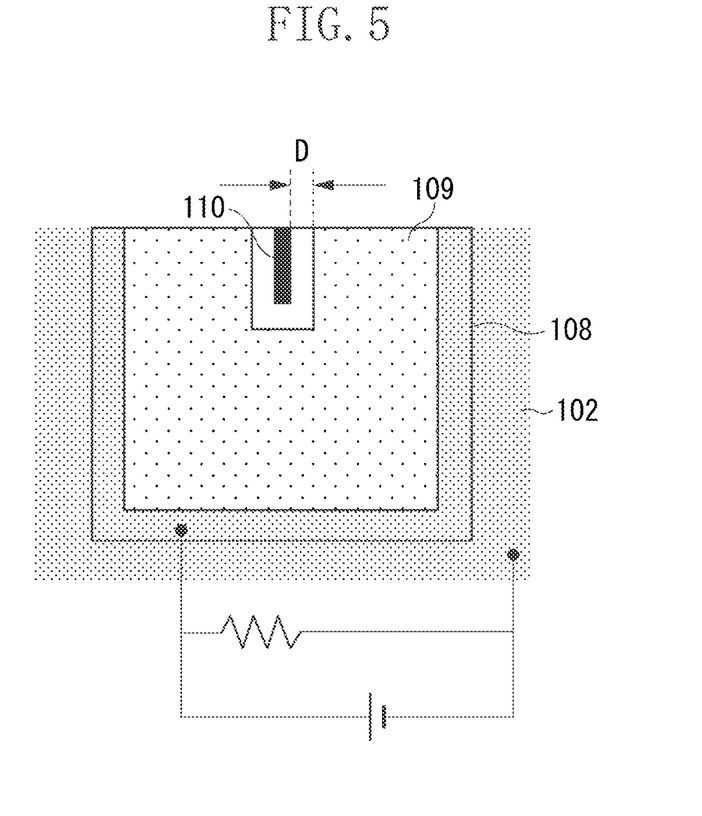
FIG. 5 is a top view of an oscillator as a first example according to the exemplary embodiment of the present invention.

The oscillator of the present exemplary embodiment will be described more specifically as a first exemplary embodiment. Referring now to FIGS. 1 to 3 and FIG. 5, the oscillator of the first concrete example of the present exemplary embodiment is described. FIG. 1 is a perspective view of an oscillator 100 according to the present example. FIG. 2 is a cross-sectional view of the oscillator 100, FIG. 3 is an equivalent circuit diagram, and FIG. 5 is a top view of the entire oscillator 100 when viewed from above. In this example, a resonator 110 employs a plasmon waveguide structure in which a first conductive layer 102, a negative resistor 103, and a second conductive layer 104 are stacked in this order. As the negative resistor 103 a semiconductor-stacking structure including an InGaAs/InAlAs triple barrier resonant-tunneling diode (RTD) is employed that generates a terahertz wave (an electromagnetic wave containing a component in a frequency range from 30 GHz to 30 THz) based on intersubband transition of carriers. The RTD structure is a semiconductor-multi-layered film having a quantum well structure in which layers are stacked in the order of: n-InGaAs (450 nm in thickness, a Si-doping concentration of $2\times10^{18}$ cm$^{-3}$); InGaAs (5 nm in thickness); AlAs (1.3 nm in thickness); InGaAs (7.6 nm in thickness); InAlAs (2.6 nm in thickness); InGaAs (5.6 nm in thickness); AlAs (1.3 nm in thickness); InGaAs (5 nm in thickness); and n-InGaAs (450 nm in thickness, a Si-doping concentration of $2\times10^{18}$ cm$^{-3}$). A highly-doped n$^+$InGaAs (400 nm, 1×10$^{19}$ cm$^{-3}$) on top and bottom sides of the RTD structure allow the RTD structure to connect to a first conductive layer 102 and a second conductive layer 104 with a comparatively low resistance. In the present example, the first conductive layer 102 constituted by a stacked film of Ti/Pd/Au/Pd/Ti (the thicknesses of the respective parts=20 nm/20 nm/400 nm/20 nm/20 nm). The second conductive layer 104 is constituted by a stacked film of Ti/Pd/Au (the thicknesses of the respective parts=20 nm/20 nm/400 nm). A substrate 101 is a p$^+$GaAs substrate connecting to the first conductive layer 102.

A resonator 110 has a Fabry-Perot resonator structure with at least two end surfaces in a direction of propagating an electromagnetic wave. The oscillator 100 utilizes reflection of the end surface of the resonator 110 to make an electromagnetic wave standing. Thus, the length of the resonator 110 in the propagation direction is a factor in determining an oscillation wavelength. In the present example, the resonator 119 has a length of 50 μm (=λg/2) and a width of 5 μm. The first conductive layer 102 and the second conductive layer 104 are disposed close to each other at a distance of about 2 μm. The resonator 110 allows an electromagnetic wave to propagate therethrough in a plasmon mode and to radiate out from an open end of the end surface thereof.

The structure of the oscillator 100 includes a resonator 110, a capacitance unit 109, and resistor 306 as described in the the aforementioned exemplary embodiment. The resistance value R of the resistor 306 may be preferably set to 1.67Ω (about 1/0.6Ω) or less because the conductance of negative differential resistance of the negative resistor 103 is about 0.6 S. In this example, the resistance value R is set to 0.33Ω.

A third conductive layer 106 includes a stacked film of Ti/Pd/Au (the thicknesses of the respective parts=20 nm/20 nm/200 nm), and a fourth conductive layer 108 includes a stacked film of Ti/Pd/Au (the thicknesses of the respective parts=20 nm/20 nm/500 nm). A dielectric layer 105 includes silicon nitride(100 nm). A preferable material for an interlayer insulation film 107 is an insulating material having a low loss at a terahertz wave band (for example, resin such as benzocyclobutene (BCB) or an inorganic material such as SiO$_2$). Among them, the present exemplary embodiment uses the BCB.

The capacitance C305 of the capacitance unit 109 should be set to suppress parasitic oscillation caused by the oscillator 100, a power supply bias circuit, or the like, and to permit the negative resistor 103 and the resonator 110 to generate an oscillation frequency $f_O$. Oscillators were formed such that the capacitance C305 of the capacitance unit 109 is about 200 pF, the resonator 110 is a length of 50 μm and a width of 5 μm (Gwg=0.6 S), and the distance D between the resonator 110 and the capacitance unit 109 is in a range of 25 μm to 260 μm. Subsequently, the presence or absence of parasitic oscillation is investigated in the oscillators. Here, the capacitance C of the capacitance unit 109 is set to equal to or higher than the inner capacitance Cwg of the resonator 110. Thus, the resonant frequency $f_{LC}$ and the series resonance frequency can be set to equal to or less than an oscillation frequency $f_O$ defined by the resonator 110. In the case of the oscillator of D=260 μm, an oscillation frequency $f_O$=0.24 THz (corresponding to λg/2) generated by the negative resistor 103 and the resonator 110 is observed. A peak of parasitic oscillation at a pitch of about 0.08 THz is also observed. Furthermore, the distance between the resonator 110 and the capacitance unit 109 is shortened (to D=160 μm, 60 μm, and 35 μm) to lower the resistance component Rs303 from 0.18Ω to 0.165Ω. Along with this change, parasitic oscillation becomes smaller. However, the parasitic oscillation is hardly suppressed in a sufficient manner. When the capacitance unit 109 is disposed closer to the resonator 110 up to D=25 μm, and the Rs is set smaller to satisfy the above Expression 1 (Rs≤0.152Ω), the parasitic oscillation can be suppressed, and an oscillation frequency $f_O$=0.24 THz due to the negative resistor 103 and the resonator 110 is observed.

Figure 4D:
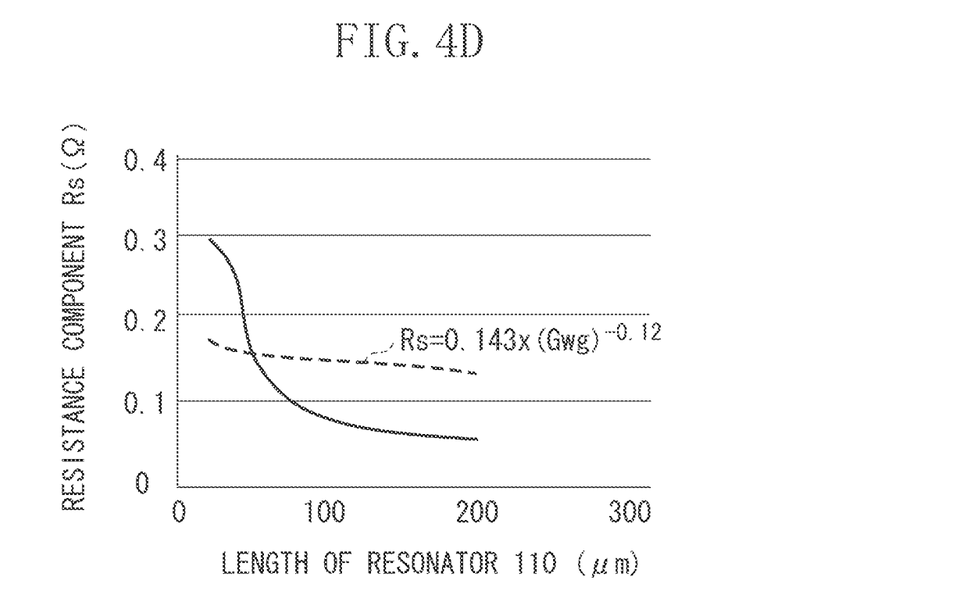
FIG. 4D is a diagram each illustrating the relationship between conductance and resistance.

Furthermore, FIG. 4D illustrates the relationship between the resistance component Rs and the length of the resonator 110 when the distance D is fixed to 25 μm, the width of the resonator 110 is fixed to 5 μm, and the length of the resonator 110 is changed from 20 μm to 200 μm. In this case, a region that satisfies the above Expression 1 is on or under a dashed line in FIG. 4D. Thus, if the resonator has a length of about 50 μm or higher, the parasitic oscillation can be suppressed.

Figure 6:
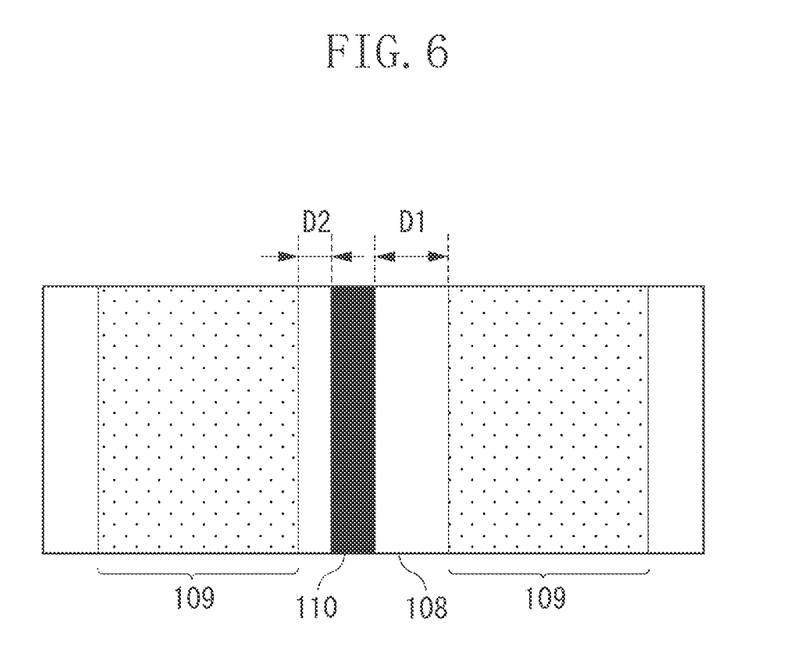
FIG. 6 is a top view of an oscillator as a second example according to the exemplary embodiment of the present invention.
Figure 7:
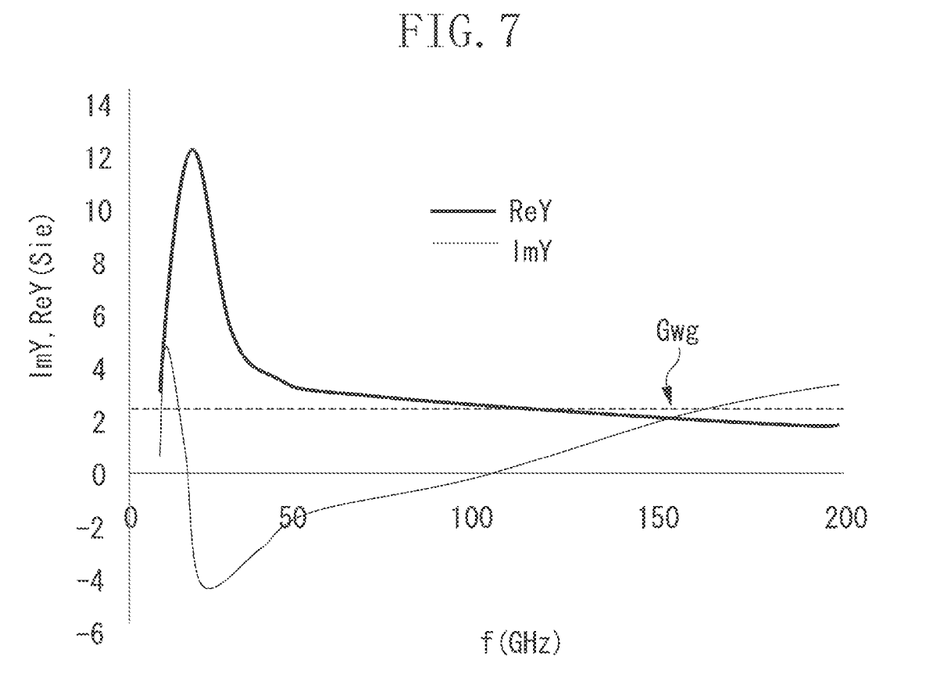
FIG. 7 is a diagram illustrating the frequency dependence of conductance of the oscillator according to the second example of the exemplary embodiment of the present invention.

FIG. 6 illustrates a schematic top view of an oscillator according to a second example. The film configurations and structures of the resonator 110 and a capacitance unit 109 are similar to those in the first example except that the resonator 110 has a length of 100 μm and a width of 10 μm (Gwg=2.41 S). In FIG. 6, the oscillator has a structure in which the position of the capacitance unit 109 is asymmetric with respect to an axis of the resonator 110 in the direction of resonance (hereinafter, also referred to as a resonant axis direction). A longer side between the resonator 110 and the capacitance unit 109 is defined as D1 and a shorter side is defined as D2. In the present example, distances on both sides are set to D1=35 μm and D2=15 μm, respectively. FIG. 7 illustrates the frequency dependency of conductance ReY and susceptance Im. A resistance Rs is calculated from the ReY at a series resonance frequency (ReY=1/Rs). The resulting resistance Rs is 0.085Ω (in FIG. 7, the series resonance frequency is an almost peak frequency of the ReY, and, using the value (12), the ReY is therefore about 1/12Ω). Thus, the result satisfies the conditions (equal to or less than 0.129Ω) of the above Expression 1 for suppressing parasitic oscillation. When confirming ReY at a resonant frequency $f_{LC}$, the ReY value is 2.60 S. which is larger than the conductance Gwg=2.41 S of the negative resistor 103. When confirming an oscillation frequency $f_O$ in the oscillator, the oscillation frequency $f_O$ is 130 GHz. Therefore, parasitic oscillation can be suppressed.

Figure 8A:
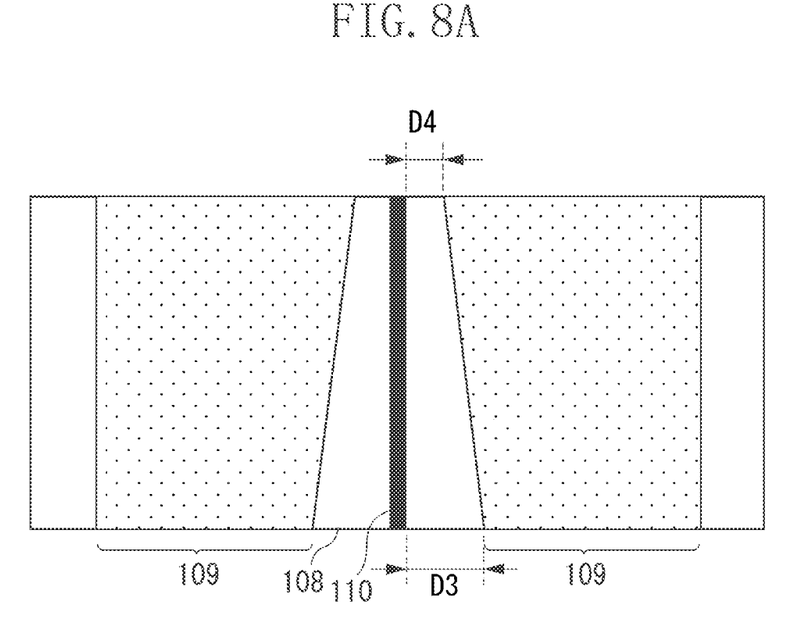
FIG. 8A is a top view of the oscillators according to a second exemplary embodiment of the present invention.
Figure 8B:
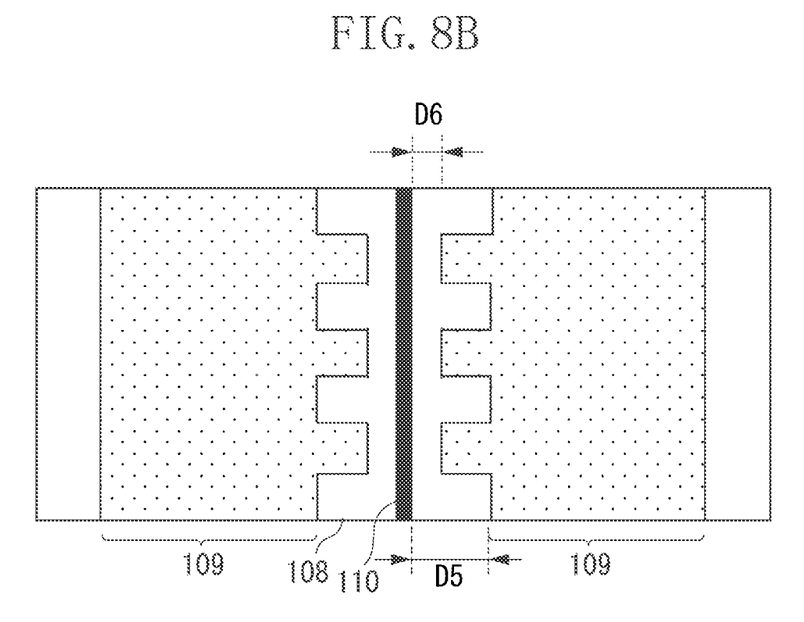
FIG. 8B is a top view of the oscillators according to a second exemplary embodiment of the present invention.

FIGS. 8A and 8B respectively illustrate schematic top views of oscillators according to a second exemplary embodiment. The film configurations and structures of the resonator 110 and a capacitance unit 109 are similar to those in the first exemplary embodiment except that the resonator 110 has a length of 200 μm and a width of 5 μm (Gwg=2.41 S). In FIG. 8A, the oscillator has a structure in which the distance D between the resonator 110 and the capacitance unit 109 varies in a tapered shape in the resonant axis direction of the resonator 110 (D3=25 μm and D4=15 μm). If a capacitance unit 109 and a fourth conductive layer 108, which connects between the resonator 110 and the capacitance unit 109, are designed based on the principle described in the aforementioned exemplary embodiment, a resistance component Rs becomes 0.129Ω or less. Therefore, parasitic oscillation can be suppressed and an oscillation frequency of 182 GHz can be obtained. The configuration of the oscillator as described above can be matched in a comparatively flexible and easy manner to the outside where an electromagnetic wave is launched.

In FIG. 8B, the oscillator has a structure in which the distance D between a resonator 110 and a capacitance unit 109 varies periodically in the resonant axis direction of the resonator 110 (D5=35 μm and D6=25 μm). If the capacitance unit 109 and a fourth conductive layer 108, which connects between the resonator 110 and the capacitance unit 109 are designed based on the principle described in the aforementioned exemplary embodiment, a resistance component Rs becomes 0.129Ω or less. Therefore, parasitic oscillation can be suppressed. The configuration of the oscillator as described above can more stabilize an oscillation frequency $f_0$.

According to the exemplary embodiments of the present invention as described above, in the capacitance unit electrically connected in parallel to the resonator having a plasmon waveguide structure or the like, the resonator and the capacitance unit are disposed in close to each other to reduce the resistance of wiring connecting between the resonator and the capacitance unit. As a result, loss of the inner capacitance of the resonator and the inductance of wiring connecting the resonator and the capacitance unit increase at a frequency of parasitic oscillation. By making the loss larger than a gain generated by the negative resistor the parasitic oscillation due to the inner capacitance of the resonator and the inductance of wiring connecting the resonator and the capacitance unit can be suppressed, thereby giving a more stable oscillation as desired.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-037666 filed Feb. 27, 2013, which is hereby incorporated by reference herein in its entirety.

The invention claimed is:

1. An oscillator, comprising:
    a resonator configured to resonate an electromagnetic wave in a resonant axis direction;
    a capacitance unit; and
    a conductor configured to electrically connect in parallel the resonator and the capacitance unit, wherein
    the resonator includes a waveguide structure including a negative resistor, a first conductive layer, and a second conductive layer, where the negative resistor has a gain to the electromagnetic wave, and is disposed between the first conductive layer and the second conductive layer that are electrically connected serially to the negative resonator,
    at a resonant frequency $f_{LC}$ generated by an inductance Ls which the conductor and the capacitance unit constitute, and an inner capacitance Cwg of the resonator, a conductance including the inductance Ls, a resistance component Rs from the conductor and the capacitance unit, and a capacitance C of the capacitance unit, is equal to or higher than an absolute value Gwg of negative conductance of the negative resistor, and
    at a series resonant frequency generated by the inductance Ls and the capacitance C, a conductance 1/Rs is equal to or higher than the absolute value Gwg.

2. The oscillator according to claim 1, wherein the first conductive layer and the second conductive layer of the resonator include negative dielectric constant medium in which a real part of dielectric constant is negative, to form a plasmon waveguide structure.

3. The oscillator according to claim 1, wherein
    at the series resonance frequency, the following condition is satisfied: $Rs \leq 0.143 \times (Gwg)^{-0.12} \Omega$.

4. The oscillator according to claim 1, wherein
    the capacitance C of the capacitance unit is equal to or higher than the inner capacitance Cwg of the resonator.

5. The oscillator according to claim 1, wherein
    the resonant frequency $f_{LC}$ is equal to or less than an oscillation frequency $f_0$ determined by the resonator.

6. The oscillator according to claim 1, wherein
    the negative resistor of the resonator includes a semiconductor multi-layered film having a quantum well structure configured to generate a terahertz wave based on intersubband transition of carriers.

7. The oscillator according to claim 1, wherein
    the electromagnetic wave is an electromagnetic wave including components in a frequency range from 30 GHz to 30 THz.

8. The oscillator according to claim 1, wherein
    the resonator has a stripe waveguide structure including the first conductive layer and the second conductive layer,
    the capacitance unit is provided in parallel with the stripe waveguide structure, and
    a distance of the conductor is a distance that satisfies a condition relating to the Rs.

9. The oscillator according to claim 1, wherein
    a distance between the resonator and the capacitance unit varies periodically in the resonant axis direction of the resonator.

10. The oscillator according to claim 1, wherein
    a distance between the resonator and the capacitance unit varies in a tapered shape in the resonant axis direction of the resonator.

* * * * *